United States Patent [19]
Nishimura

[11] Patent Number: 5,721,148
[45] Date of Patent: Feb. 24, 1998

[54] METHOD FOR MANUFACTURING MOS TYPE SEMICONDUCTOR DEVICE

[75] Inventor: Takeyoshi Nishimura, Nagano, Japan

[73] Assignee: Fuji Electric Co., Japan

[21] Appl. No.: 759,943

[22] Filed: Dec. 3, 1996

[30] Foreign Application Priority Data

Dec. 7, 1995 [JP] Japan .................... 7-318798

[51] Int. Cl.⁶ .............................. H01L 21/265
[52] U.S. Cl. .................. 437/40; 437/41; 437/203; 148/DIG. 126
[58] Field of Search ................ 437/40, 41, 52, 437/203; 148/DIG. 126

[56] References Cited

U.S. PATENT DOCUMENTS

| | | | |
|---|---|---|---|
| 4,984,030 | 1/1991 | Sunami et al. | 357/23.6 |
| 5,081,052 | 1/1992 | Kobayashi et al. | 437/29 |
| 5,208,172 | 5/1993 | Fitch et al. | 437/40 |
| 5,244,824 | 9/1993 | Sivan | 437/52 |
| 5,424,231 | 6/1995 | Yang | 437/40 DM |
| 5,429,970 | 7/1995 | Hong | 437/43 |
| 5,474,943 | 12/1995 | Hshieh et al. | 437/40 DM |
| 5,510,287 | 4/1996 | Chen et al. | 437/45 |
| 5,514,604 | 5/1996 | Brown | 437/40 DM |
| 5,576,245 | 11/1996 | Cogan et al. | 437/40 DM |

FOREIGN PATENT DOCUMENTS

| | | |
|---|---|---|
| 4145628A | 5/1992 | Japan . |
| 5304297A | 11/1993 | Japan . |
| 5335585A | 12/1993 | Japan . |

*Primary Examiner*—John Niebling
*Assistant Examiner*—Michael S. Lebentritt
*Attorney, Agent, or Firm*—Rossi & Associates

[57] ABSTRACT

In a method for manufacturing a MOS type semiconductor device, a first conductivity type layer is formed in a surface layer of a second conductivity type base region on a first conductivity type drain layer, a gate trench is formed in the base region, and a gate electrode is then formed in the gate trench through a gate insulation film. An exposed surface of the obtained structure is covered with an inter-layer insulation film, and a source contact trench that reaches inside the second conductivity type base region is formed through the inter-layer insulation film and first conductivity type layer while a gate contact trench that reaches inside the gate electrode is formed through the inter-layer insulation film. A portion of the inter-layer insulation film and the source contact trench are covered with a first metal film that forms a source electrode, and another portion of the inter-layer insulation film and the gate contact trench are covered with a second metal film that forms a gate metal electrode.

3 Claims, 10 Drawing Sheets

METHOD FOR MANUFACTURING MOS TYPE SEMICONDUCTOR DEVICE

FIELD OF THE INVENTION

The present invention relates to a MOS type semiconductor device, such as MOSFET (metal-oxide-semiconductor field-effect transistor) having a trench structure, IGBT (insulated gate bipolar transistor), and intelligent power module (IPM).

BACKGROUND OF THE INVENTION

Figure 8A:
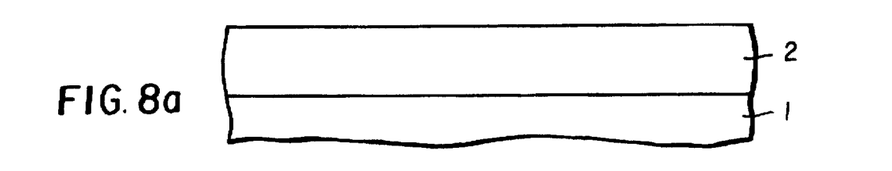
FIGS. 8(a) through 8(e) are views showing process steps to be carried out in this order in a known method for manufacturing a MOS type semiconductor device having a trench structure.
Figure 8B:
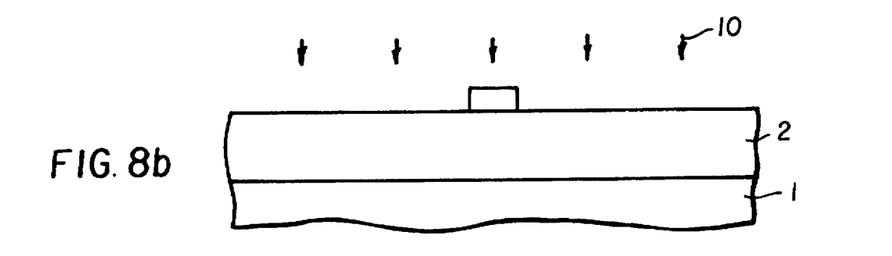
Figure 8C:
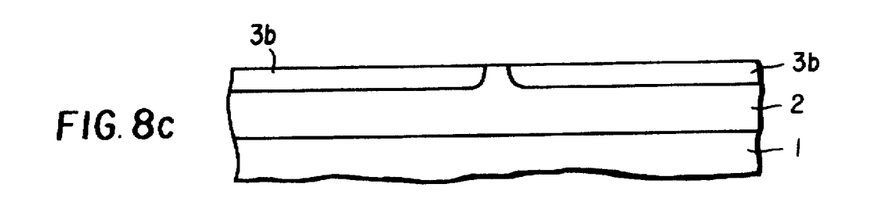
Figure 8D:
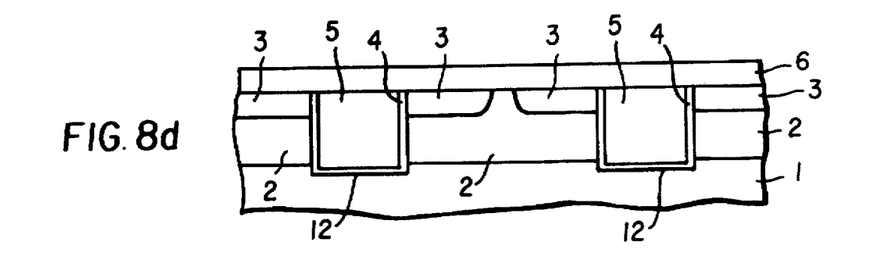
Figure 8E:
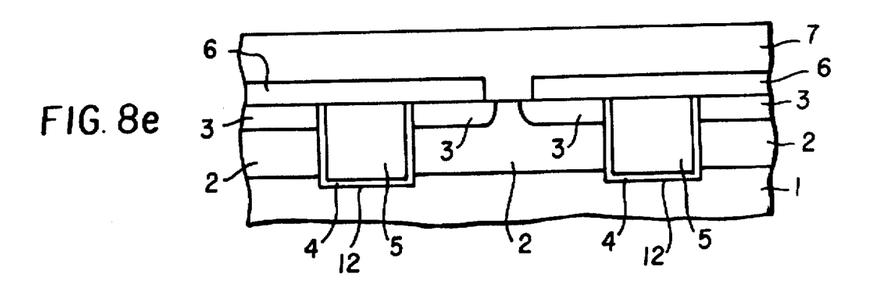

FIGS. 8(a) through FIG. 8(e) are views showing process steps to be carried out in the illustrated order in a known method for manufacturing a MOS type semiconductor device having a trench structure. Initially, a p-type base region 2 is formed by diffusing boron, for example, into an n-type semiconductor substrate 1, as shown in FIG. 8(a). A mask consisting of a resist 9 that has been suitably patterned in an exclusive photolithography process is then formed on the base region 2, and source ions 10, such as arsenic or phosphorus ions, are implanted into the base region 2 as shown in FIG. 8(b). After n-type regions 3b are thus formed, the mask 9 is removed as shown in FIG. 8(c). Gate trench 12 that reaches the semiconductor substrate 1 is then formed, and gate insulation film 4 is formed to cover the inner wall of the trench 12. Thereafter, the gate trench 12 is filled with polysilicon, for example, so as to form a gate electrode 5, and the entire surface of the obtained structure is covered with an inter-layer insulation film 6, as shown in FIG. 8(d). Gate and source contact holes are formed through the inter-layer insulation film 6, and a source electrode 7 that contacts exposed surfaces of both of the base region 2 and source regions 3 and a gate metal electrode (not shown) that contacts the gate electrode are then formed, as shown in FIG. 8(e).

Figure 9A:
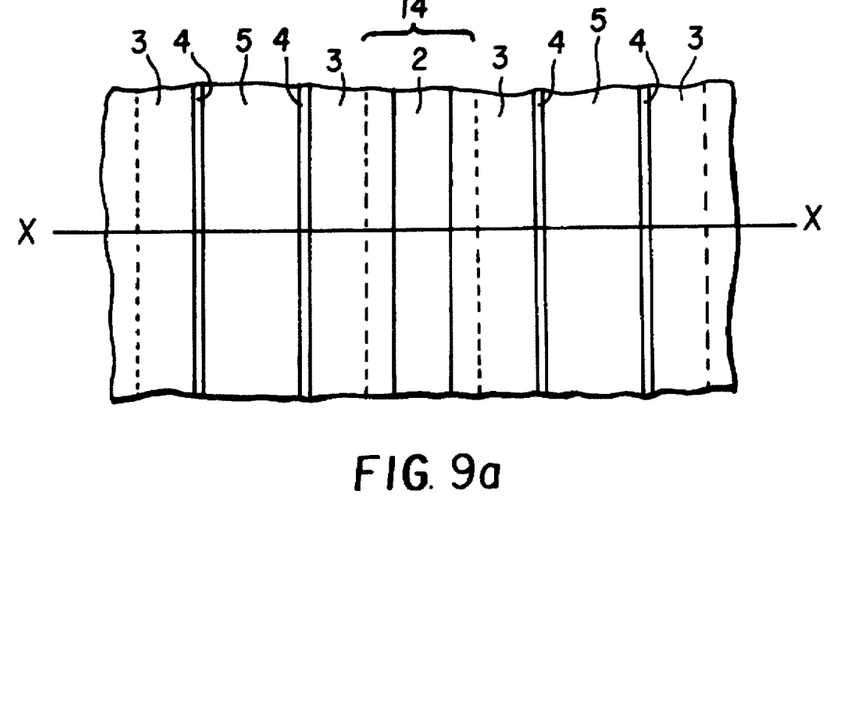
FIG. 9(a) is a plan view showing a principal part of a MOS type semiconductor device produced by the known method and having stripe-shaped cells and trenches.
Figure 9B:
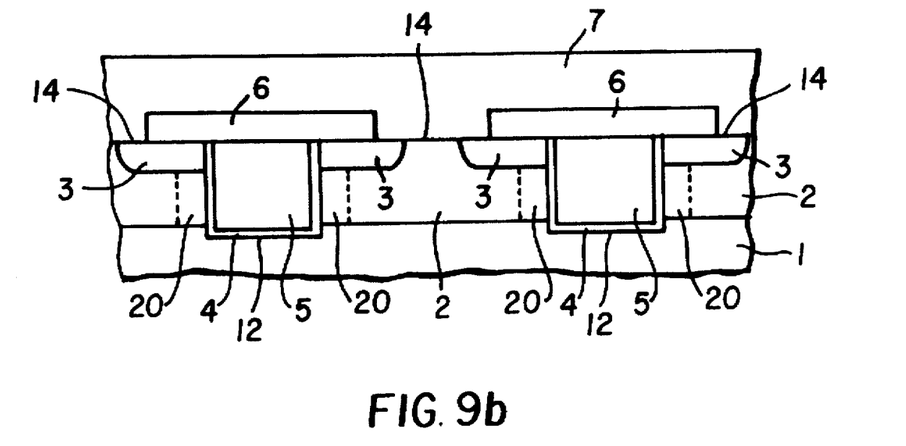
FIG. 9(b) is a cross sectional view taken along line X—X of FIG. 9(a)

FIGS. 9(a) and 9(b) are views showing a principal part of a MOS type semiconductor device having a trench structure with stripe-shaped cells and fabricated by the known manufacturing method, wherein FIG. 9(a) is a plan view showing the top surface of the semiconductor device from which electrodes, inter-layer insulation film and others are omitted, and FIG. 9(b) is a cross sectional view taken along line X—X of FIG. 9(a). As shown in these figures, a p-type base region 2 is formed in a surface layer of an n-type semiconductor substrate 1, and n-type source regions 3 are selectively formed in surface layers of the base regions 2. Gate trenches 12 are formed by etching in the p-type base regions 2 and n-type source regions 3, and each of the gate trenches 12 is covered at its inner wall with a gate insulation layer 4 and receives a gate electrode 5 made of polysilicon, for example. Source electrode 7 (main electrode) and gate metal electrode (not shown) are then formed on the obtained structure, through an inter-layer insulation film 6 having contact holes. Channel regions 20 are formed in side face regions of the base regions 2 that face side faces of the gate electrodes 5.

Figure 10A:
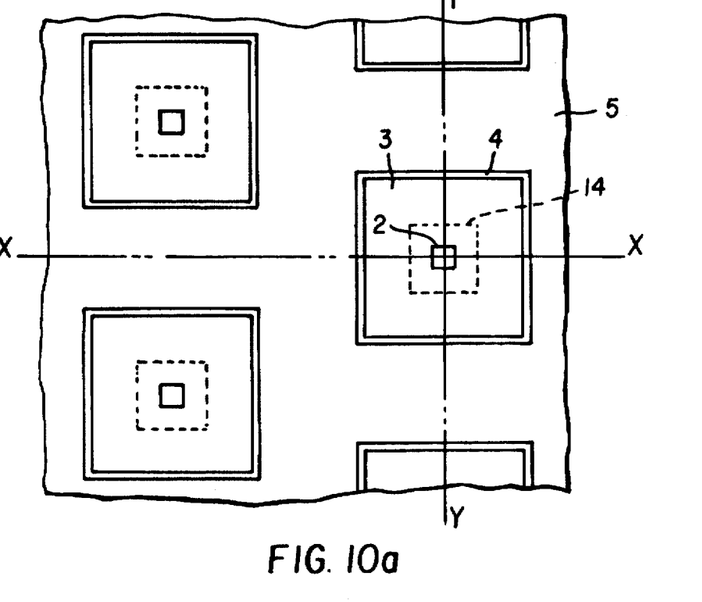
FIG. 10(a) is a plan view showing a principal part of a MOS type semiconductor device produced by the known method and having square cells and a trench.
Figure 10B:
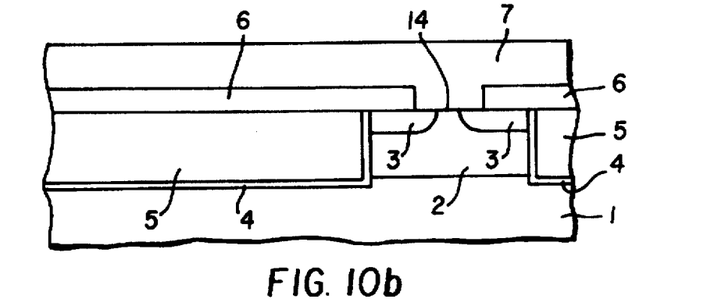
FIG. 10(b) is a cross sectional view taken along line X—X of FIG. 10(a)
Figure 10C:
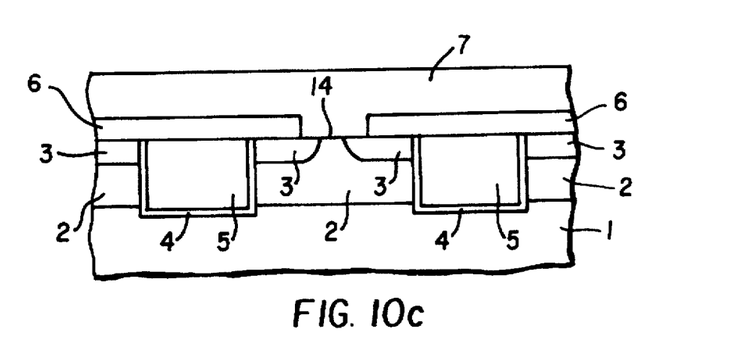
FIG. 10(c) is a cross sectional view taken along line Y—Y of FIG. 10(a).

FIGS. 10 (a) and 10(b) are views showing a principal part of a MOS type semiconductor device having a trench structure with square cells and fabricated by the known manufacturing method, wherein FIG. 10(a) is a plane view of the device, FIG. 10(b) is a cross sectional view taken along line X-X of FIG. 10(a), and FIG. 10(c) is a cross sectional view taken along line Y—Y of FIG. 10(a). This semiconductor device has a cell structure having square cells, rather than stripe-shaped cells as employed in the device of FIG. 9.

To produce the above-described MOS-type semiconductor devices having a trench structure, an exclusive resist or photomask is needed for forming the source regions, resulting in increased steps related to photolithography and increased manufacturing cost. Further, in the known method as described above, the contact between the source regions and the source electrode is only made at the surface of the semiconductor substrate, which prevents formation of more minute or fine cells. Further, if there arises a shift or difference in position between the photomask used for forming the source regions and a photomask used for forming the contact holes, the semiconductor devices thus manufactured may suffer from a variation in their element characteristics.

SUMMARY OF THE INVENTION

It is therefore an object of the present invention to provide a MOS type semiconductor device having a trench structure, which can be manufactured at a reduced cost due to a reduced number of process steps, and which assures improved contact between source electrode and source regions and shows a reduced variation in its element characteristics.

The above object may be accomplished according to a first aspect of the present invention, which provides a method for manufacturing a MOS type semiconductor device, comprising the steps of forming a first conductivity type layer in a surface layer of a second conductivity type base region on a first conductivity type drain layer; forming a gate trench; forming a gate electrode in the gate trench through a gate insulation film; covering an exposed surface of the first conductivity type layer and the gate electrode with an inter-layer insulation film, and dividing the inter-layer insulation film and the first conductivity type layer so as to concurrently form a source contact trench that reaches inside the second conductivity type base region, and a gate contact trench that extends through the inter-layer insulation film and reaches inside the gate electrode; and covering a first portion of the inter-layer insulation film and the source contact trench with a first metal film so as to form a source electrode, and covering a second portion of the inter-layer insulation film and the gate contact trench with a second metal film so as to form a gate metal electrode.

According to a second aspect of the present invention, there is provided a method for manufacturing a MOS type semiconductor device, comprising the steps of forming a second conductivity type base region on a first conductivity type drain layer with an insulating film formed as a surface layer of the second conductivity type base region; leaving a part of the insulating film on the second conductivity type base region; forming first conductivity type source regions such that the insulating film is used as a mask for forming the source regions; forming a gate trench; forming a gate electrode in the gate trench through a gate insulation film; covering exposed surfaces of the first conductivity type source regions and the gate electrode with an inter-layer insulation film, forming a first hole through the inter-layer insulation film, and removing the part of the insulating film to form a second hole through the inter-layer insulation film; and forming a gate metal electrode and a source electrode such that the gate metal electrode is in contact with the gate electrode through the first hole, and such that the source electrode is in contact with the second conductivity type base region and the first conductivity type source region through the second hole.

According to a third aspect of the present invention, there is provided a method for manufacturing a MOS type semiconductor device, comprising the steps of forming a gate trench that extends from a surface of a second conductivity type base region formed on a first conductivity type drain layer; forming an insulating film on a surface of the second conductivity base region, and then forming a conductive film on the insulating film; leaving a first part of the insulating film and the conductive film on the surface of the base region, and a second part of the insulating film and the conductive film that is located in the gate trench, while removing a remaining part of the insulating film and the conductive film; forming first conductivity type source regions in a surface layer of the second conductivity type base region, and covering exposed surfaces of the first conductivity type source regions and the gate electrode with an inter-layer insulating film, forming a first hole through the inter-layer insulation film, and removing the first part of the insulating film and the conductive film left on the base region to form a second hole through the inter-layer insulation film, and forming a gate metal electrode and a source electrode such that the gate metal electrode is in contact with the gate electrode through the first hole and the source electrode is in contact with the second conductivity type base region and the first conductivity type source region through the second hole.

According to the methods as described above, an exclusive photolithography process for forming the first conductivity type source regions can be eliminated. Further, there arises no shift or difference in position between the source electrode, and the first conductivity type source regions and first conductivity type drain region that are to be in contact with the source electrode, which shift had been a problem in the conventional method. Moreover, the gate contact trench formed in the gate electrode received in the gate trench allows contact between the gate metal electrode formed of a metal film and the gate electrode formed of polysilicon, for example. The source contact trench and the gate contact trench can be formed at the same time. With the gate contact trench formed into the gate electrode received in the gate trench, the gate contact trench is prevented from extending through the gate electrode and reaching the second conductivity type base region, thus avoiding deterioration in the characteristics of the resultant device.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 1A:
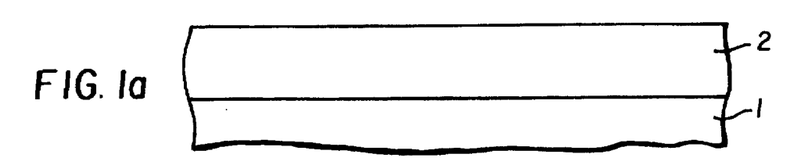
FIGS. 1(a) through 1(e) are views showing process steps to be carried out in this order in a manufacturing method according to the first embodiment of the present invention.
Figure 1B:
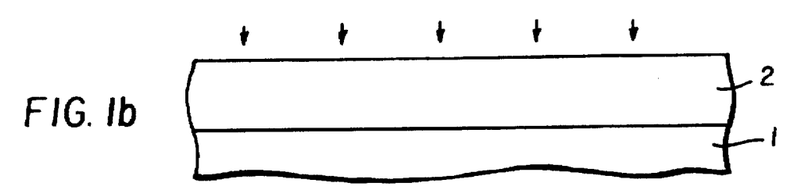
Figure 1C:
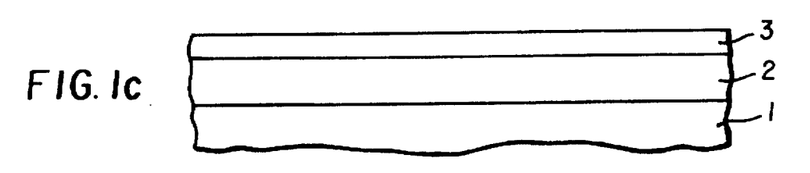
Figure 1D:
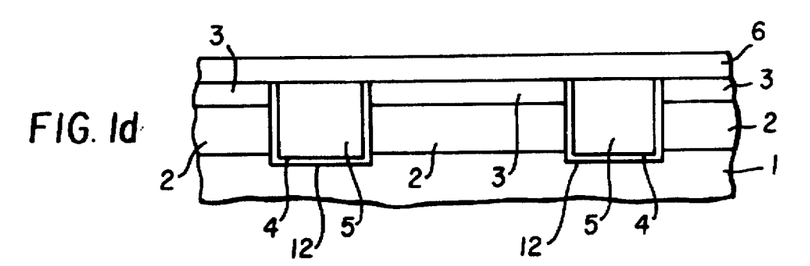
Figure 1E:
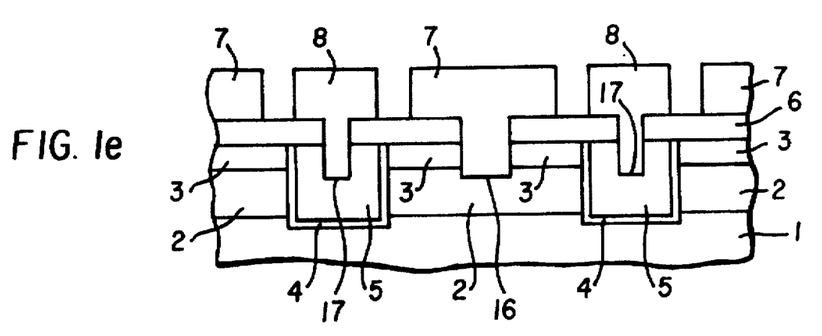

FIGS. 1(a) through 1(e) are views showing process steps that are to be carried out in the illustrated order in a method for manufacturing a semiconductor device according to the first embodiment of the present invention. Initially, a p-type base region 2 is formed by diffusing boron, for example, into a semiconductor substrate 1 (which will form a drain layer), as shown in FIG. 1 (a). Source ions 10, such as arsenic (As) or phosphorus (P) ions, are then implanted into this base region 2 as shown in FIG. 1(b), to form an n-type layer 3a in a surface layer of the base region 2 as shown in FIG. 1(c). Gate trench 12 is then formed so as to extend from the surface of the n-type layer 3a down to the semiconductor substrate 1. After an inner wall of the gate trench 12 is covered with a gate insulation film 4, the trench 12 is filled with polysilicon, for example, so as to form a gate electrode 5, and the entire surface of the obtained structure is covered with an inter-layer insulation film 6 as shown in FIG. 1(d). Contact holes are formed through the inter-layer insulation film 6, and trenches (source contact trenches 16) that reach inside the base region 2 and trenches (gate contact trenches 17) that reach inside the gate electrode 5 are formed, using the inter-layer insulation film 6 with the contact holes as a mask, thereby to form n-type source regions 3. Further, source electrodes 7 (main electrode) that contact side faces of both of the source regions 3 and base regions 2, and gate metal electrodes 8 (formed film a metal film) that contact the gate electrode 5 are formed, as shown in FIG. 1(e).

Figure 2A:
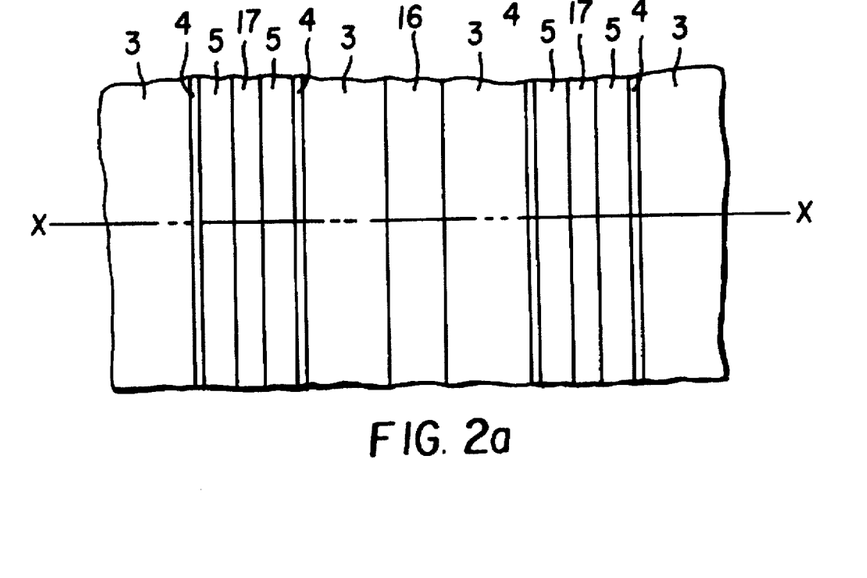
FIG. 2(a) is a plan view showing a principal part of a MOS type semiconductor device produced by the method of FIG. 1 and constructed to include stripe-shaped cells and trenches.
Figure 2B:
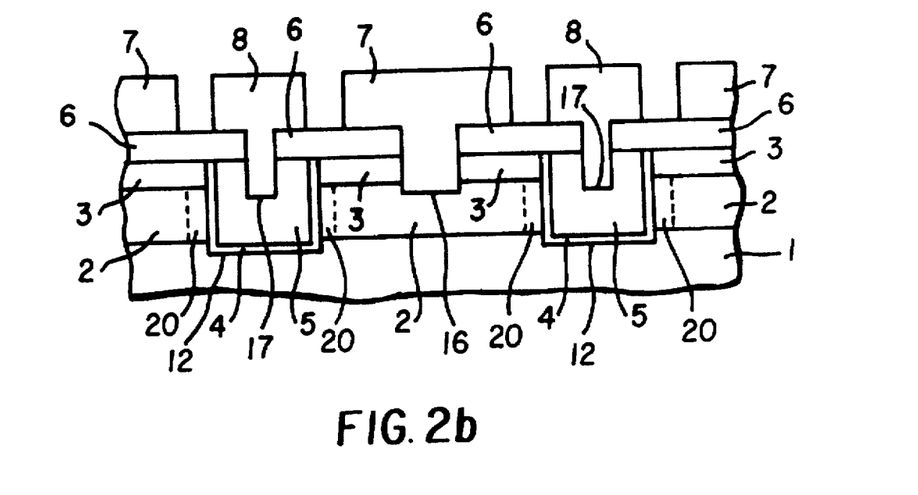
FIG. 2(b) is a cross sectional view taken along line X—X of FIG. 2(a)

FIGS. 2(a) and 2Co) illustrate a principal part of a MOS type semiconductor device fabricated by the method of the first embodiment and having a trench structure with stripe-shaped cells, wherein FIG. 2(a) is a plan view showing the top surface of the device from which source and gate metal electrodes, inter-layer insulation film and others are omitted, and FIG. 2(b) is a cross sectional view taken along line X—X of FIG. 2(a). As shown in these figures, stripe-shaped base regions 2 are formed in a surface layer of a semiconductor substrate 1, and source regions 3 are formed in a surface layer of the base region 2. Gate trenches 12 are formed in the shape of stripes so as to reach the semiconductor substrate 1, and a gate insulation film 4 is formed on the inner wall of each of the gate trenches 12. The gate trenches 12 are then filled with polysilicon, for example, to form gate electrodes 5. Contact holes are formed through an inter-layer insulation film 6 formed on the source regions 3, and source electrodes 7 that contact both of the source regions 3 and base region 2 and gate metal electrodes 8 connected to the gate electrodes 5 are formed. The gate metal electrodes 8 are connected to a metal film provided in a gate pad portion (not shown). With a gate voltage applied to the gate electrodes 5, channel regions 20 are formed in side face regions of the base regions 2 that face side faces of the gate electrodes 5.

Figure 3A:
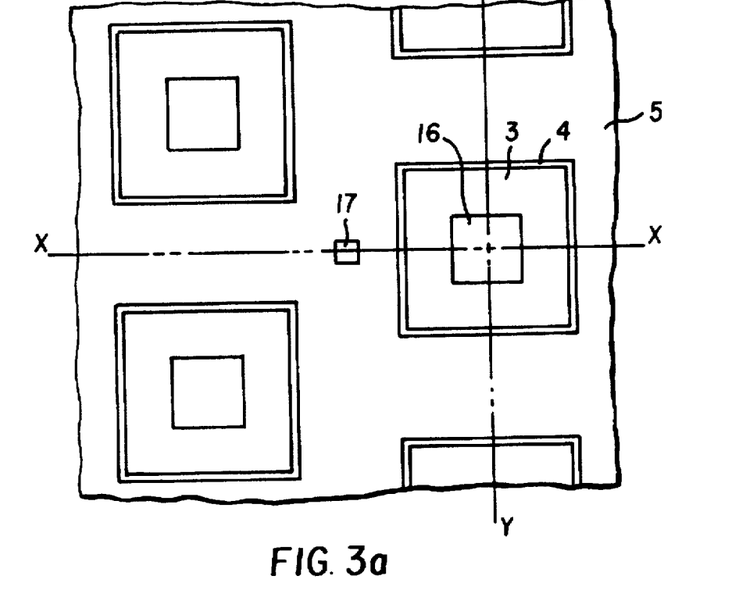
FIG. 3(a) is a plan view showing a principal part of a MOS type semiconductor device produced by the method of FIG. 1 and constructed to include square cells and a trench.
Figure 3B:
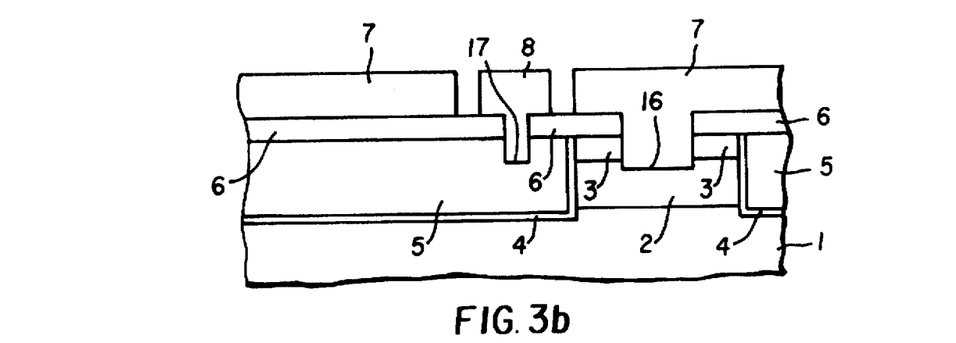
FIG. 3(b) is a cross sectional view taken along line X—X of FIG. 3(a)
Figure 3C:
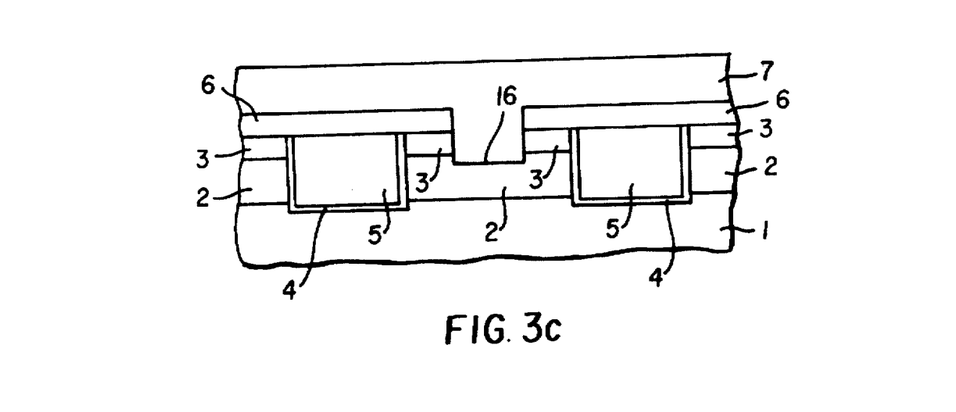
FIG. 3(c) is a cross sectional view taken along line Y—Y of FIG. 3(a)

FIGS. 3(a)–3(c) illustrate a principal part of a MOS type semiconductor device fabricated by the method of the first embodiment and having a trench structure with square cells, wherein FIG. 3(a) is a plan view of the device, FIG. 3(b) is a cross sectional view taken along line X—X of FIG. 3(a), and FIG. 3(c) is a cross sectional view taken along line Y—Y of FIG. 3(a). This semiconductor device has a cell structure having square cells, rather than stripe-shaped cells as employed in the device of FIG. 2. The source contact trenches 16 of FIGS. 3(b), 3(c) that allow contact between the source electrodes 7 and both of the source region 3 and base region 2, and the gate contact trenches 17 of FIG. 3(b) that allow contact between the gate metal electrode 8 and the gate electrode 5 are formed at the same time, using the inter-layer insulation film 6 with the contact holes as a mask. The gate metal electrodes 8 may be connected to a metal film of a gate pad (not shown) such that they are insulated from the source electrodes 7, or may serve themselves as a gate pad.

Figure 4A:
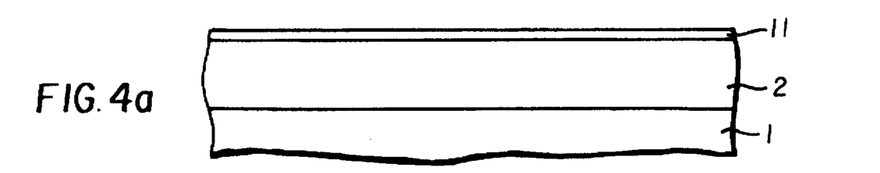
FIGS. 4(a) through 4(e) are views showing process steps to be carried out in this order in a manufacturing method according to the second embodiment of the present invention.
Figure 4B:
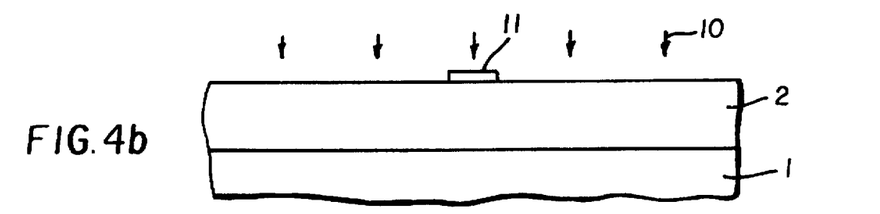
Figure 4C:
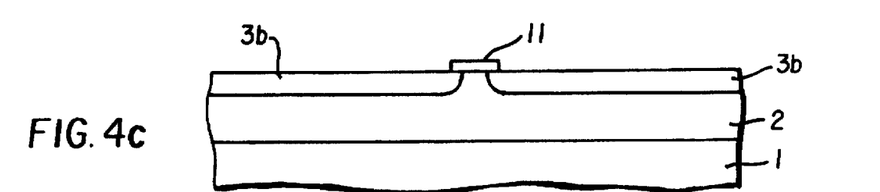
Figure 4D:
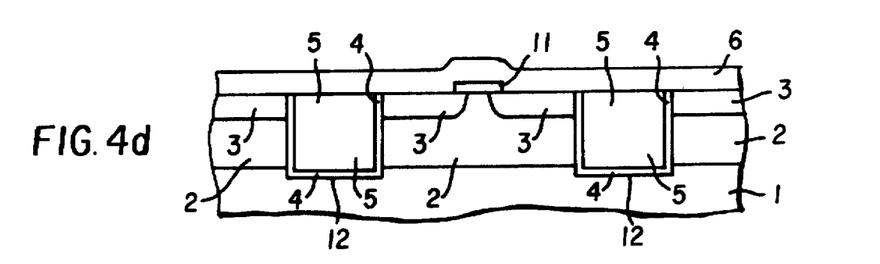
Figure 4E:
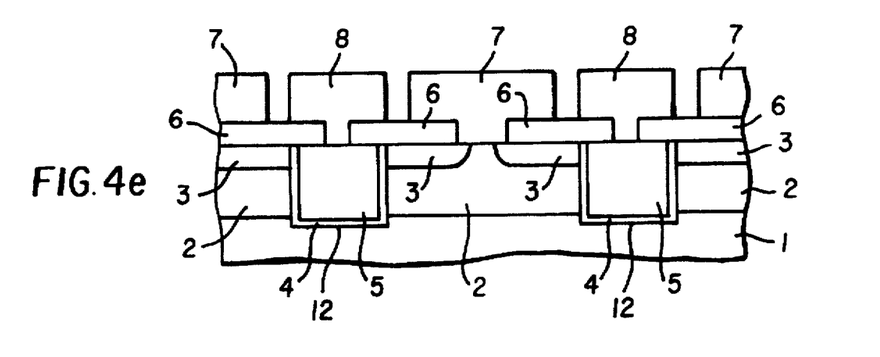

FIGS. 4(a) through FIG. 4(e) are views showing process steps that are to be carried out in this order in a method for manufacturing a semiconductor device according to the second embodiment of the present invention. Initially, a base region 2 is formed by diffusing boron, for example, into a semiconductor substrate 1, and an oxide film 11 a is formed during heat treatment conducted to form this base region 2, as shown in FIG. 4(a). A mask of oxide film 11 used for forming source regions is formed from the oxide film 11 a in the same photolithography step in which regions (such as field plate regions) other than the source regions are formed. Source ions 10, such as arsenic (As) ions, are then implanted as shown in FIG. 4(b), and the source regions 3 are formed in a surface layer of the base region 2 as shown in FIG. 4(c). Gate trench 12 that reaches the semiconductor substrate 1 is then formed, and the inner wall of the gate trench 12 is covered with a gate insulation film 4. Thereafter, the gate trench 12 is filled with polysilicon, for example, so as form a gate electrode 5, and the entire surface of the obtained structure is covered with an inter-layer insulation film 6, as shown in FIG. 4(d). The oxide film 11 is removed when contact holes are formed through the inter-layer insulation film 6, and source electrodes 7 that contact both of the base region 2 and source regions 3 and gate metal electrodes 8 that contacts the gate electrode 5 are then formed.

Figure 5A:
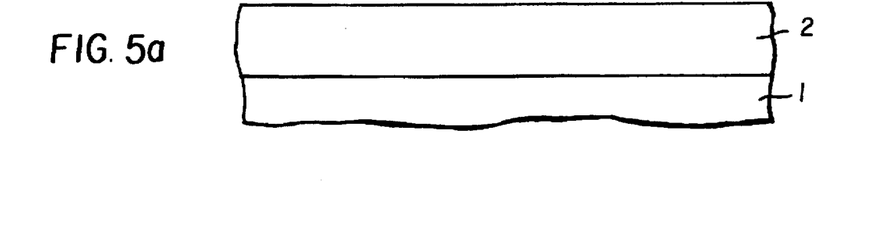
FIGS. 5(a) through 5(e) are views showing process steps to be carried out in this order in a manufacturing method according to the third embodiment of the invention.
Figure 5B:
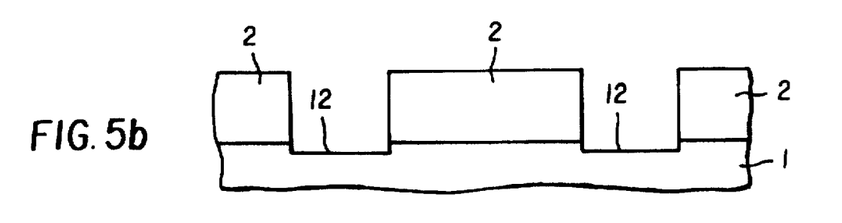
Figure 5C:
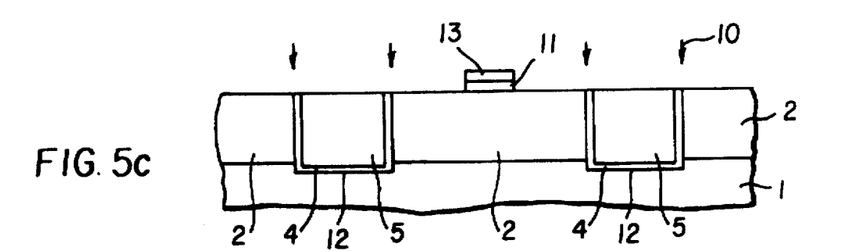
Figure 5D:
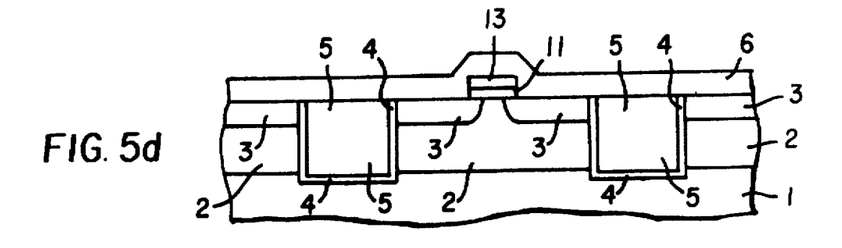
Figure 5E:
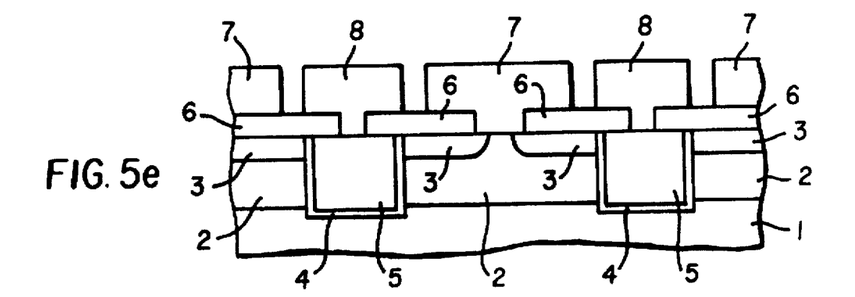

FIGS. 5(a) through FIG. 5(e) are views showing process steps that are to be carried out in this order in a method for manufacturing a semiconductor device according to the third embodiment of the present invention. Initially, a base region 2 is formed by diffusing boron, for example, in a semiconductor substrate 1 as shown in FIG. 5(a). FIG. 5(a) shows the semiconductor substrate 1 and base region 2 from which is removed an oxide film formed during heat treatment for forming the base region 2. Gate trench 12 is then formed by etching (that may be called trench etching), as shown in FIG. 5(b). An oxide film 11 and a polysilicon film 13 that provide a gate insulation film 4 and a gate electrode 5, respectively, are also formed on the surface of the base region 2, and these oxide film 11 and polysilicon film 13 on the base region 2 are suitably patterned to provide a mask for forming source regions, in the same photolithography step in which regions other than the source regions are formed. With the mask thus formed on the base region 2, source ions 10, such as arsenic (As) ions, are implanted into the base region 2 as shown in FIG. 5(c), to form the source regions 3. Thereafter, the entire surface of the obtained structure is covered with an inter-layer insulation film 6 as shown in FIG. 5(d). The polysilicon film 13 and oxide film 11 are removed at the same time that contact holes are formed through the inter-layer insulation film 6, and source electrodes 7 that contact surfaces of both of the base region 2 and source regions 3 and gate metal electrodes 8 that contact the gate electrode 5 are formed as shown in FIG. 6(e).

Figure 6A:
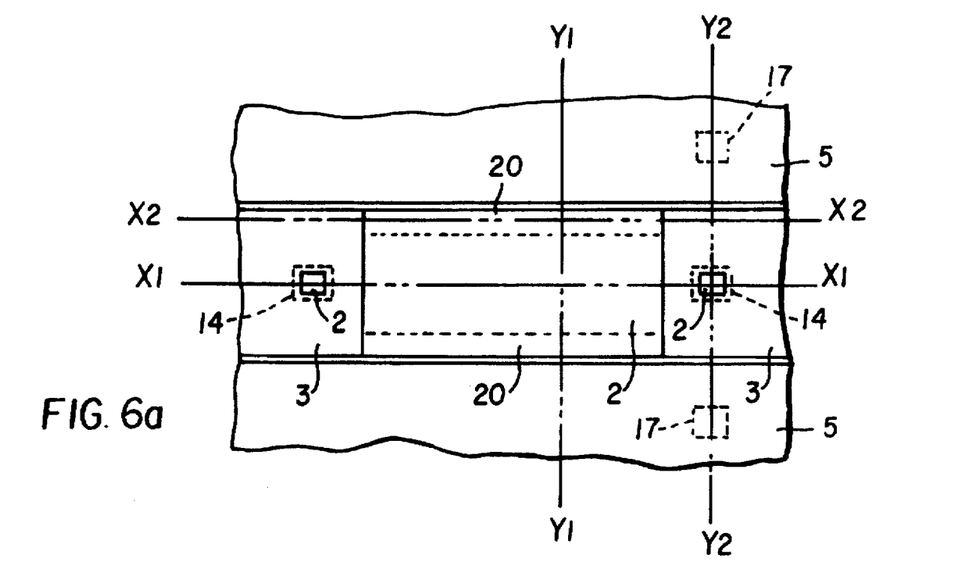
FIG. 6(a) is a plan view showing the construction of a variable resistor produced by a method to which the first embodiment is applied.
Figure 6B:
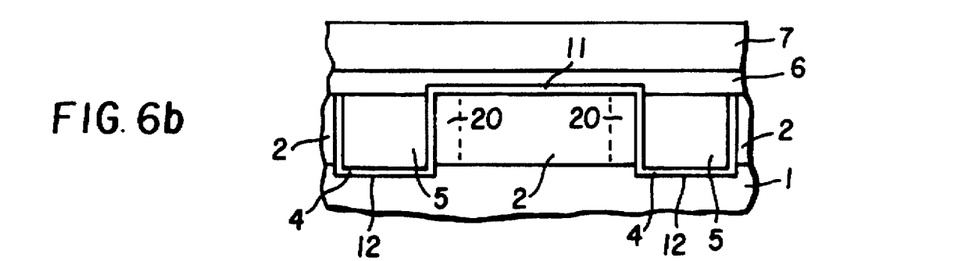
FIG. 6(b) is a cross sectional view taken along line $Y_1-Y_1$ of FIG. 6(a)
Figure 6C:
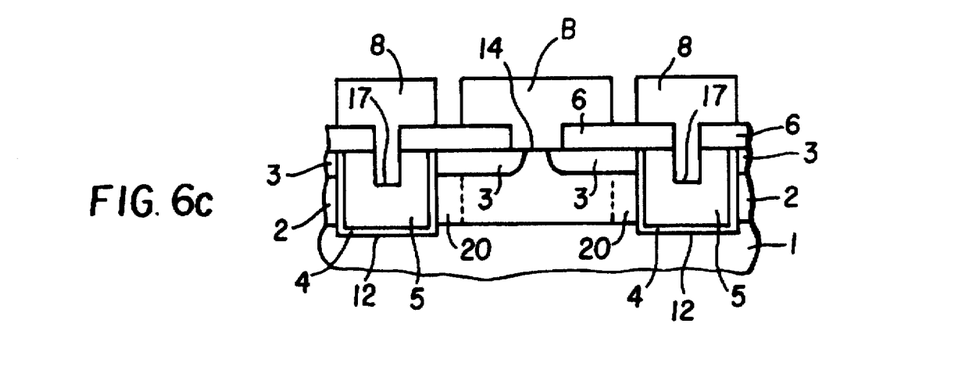
FIG. 6(c) is a cross sectional view taken along line $Y_2-Y_2$ of FIG. 6(a)

Applying the method of the first embodiment of the present invention, a variable resistor can be formed. As shown in FIGS. 6(a)–6(c), the structure of a variable resistor fabricated by a method to which the first embodiment is applied, wherein FIG. 6(a) is a plan view showing the top surface of the semiconductor device from which electrodes and inter-layer insulation film are omitted, FIG. 6(b) is a cross sectional view taken along line $Y_1$-$Y_1$ of FIG. 6(a), and FIG. 6(c) is a cross sectional view taken along line $Y_2$-$Y_2$ of FIG. 6(a). Initially, source regions 3 are selectively formed in a base region 2, and gate trenches 12 are formed, followed by formation of oxide films 4, 11 on the inner wall and surface of the gate trenches 12 and base region 2. The gate trenches 12 are filled with polysilicon, for example, so as to form gate electrodes 5. The entire surface of the obtained structure is covered with an inter-layer insulation film 6, and source contact holes 14 and gate contact trenches 17 are formed through the inter-layer insulation film 6. Gate metal electrodes 8, electrode B (corresponding to source electrode) and electrode A (not shown) are then formed.

Figure 7A:
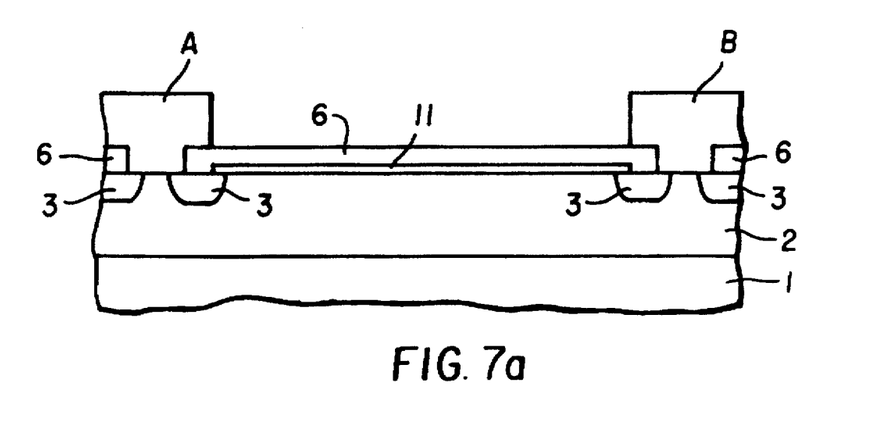
FIG. 7(a) is a cross sectional view taken along line $X_1-X_1$ of FIG. 6(a)
Figure 7B:
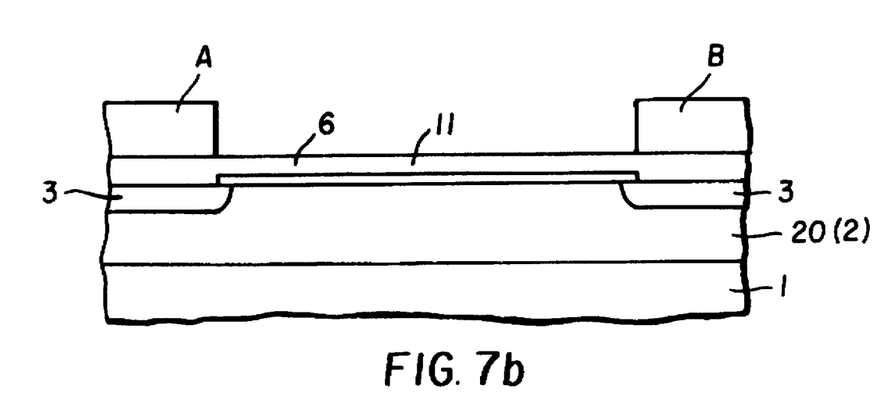
FIG. 7(b) is a cross sectional view taken along line $X_2-X_2$ of FIG. 6(a)

FIG. 7(a) is a cross sectional view taken along line $X_1$-$X_1$ of FIG. 6(a), and FIG. 7(b) is a cross sectional view taken along line $Y_2$-$Y_2$ of FIG. 6(a). The electrode A corresponding to the source electrode and the electrode B are spaced apart from each other. There will be explained how the structure of FIGS. 6 and 7 operates as a variable resistor. If a voltage is applied between the electrode A and the electrode B when no voltage is applied to the gate metal electrode 8, carriers flow through the base region 2 that contacts the electrode A and the electrode B. The resistance of passage through which the carriers flow is determined by the diffusion concentration of the base region 2, and depth, width and length of the base region 2. If a gate voltage is applied to the gate electrodes 5, channel regions 20 are formed in side face regions of the base region 2 that face the gate electrodes 5. If a voltage is applied between the electrode A and the electrode B in this condition, current components flowing through the channel regions 20 are added as carriers, and the resistance is accordingly reduced. Since the size of the channel regions 20 depends on the gate voltage, the resistance can be varied as desired by varying the gate voltage, thus providing a variable resistor. When this variable resistor is formed on the same substrate on which the MOS type device, such as MOSFET or IGBT, is formed, the resistor should be formed in a region that is separated from the MOS type device with an insulating layer or a junction.

According to the present invention, an exclusive photolithography process for forming the source regions is not required in the production of the MOS type semiconductor device, and the manufacturing cost can be thus reduced. In the present method, a layer having the same conductivity type as the source regions is formed in the surface layer of the base region, and the source regions are formed by dividing or splitting this layer by a trench that reaches the base region, while covering this trench with a metal film that provides the source electrode. In this arrangement, the source electrode can be brought into contact with both of the source regions and base region, making it unnecessary to match patterns of photomasks for forming the source regions and contact holes as required in the known method, assuring increased density of cells and reduced variation in the element characteristics of the devices.

What is claimed is:

1. A method for manufacturing a MOS type semiconductor device, comprising the steps of:

forming a first conductivity type layer in a surface layer of a second conductivity type base region on a first conductivity type drain layer;

forming a gate trench;

forming a gate electrode in said gate trench on a gate insulation film;

covering an exposed surface of said first conductivity type layer and said gate electrode with an inter-layer insulation film, and dividing the inter-layer insulation film and the first conductivity type layer so as to concurrently form a source contact trench that reaches inside said second conductivity type base region, and a gate contact trench that extends through said inter-layer insulation film and reaches inside said gate electrode; and covering a first portion of said inter-layer insulation film and said source contact trench with a first metal film so as to form a source electrode, and covering a second portion of said inter-layer insulation film and said gate contact trench with a second metal film so as to form a gate metal electrode.

2. A method for manufacturing a MOS type semiconductor device, comprising the steps of:

forming a second conductivity type base region on a first conductivity drain layer with an insulating film formed as a surface layer of the second conductivity type base region;

leaving a part of said insulating film on said second conductivity type base region;

forming first conductivity type source regions such that said insulating film is used as a mask for forming the source regions;

forming a gate trench;

forming a gate electrode in said gate trench on a gate insulation film;

covering exposed surfaces of said first conductivity type source regions and said gate electrode with an inter-layer insulation film, forming a first hole through the inter-layer insulation film, and removing said part of said insulating film to form a second hole through the inter-layer insulation film; and forming a gate metal electrode and a source electrode such that the gate metal electrode is in contact with said gate electrode through said first hole, and such that the source electrode is in contact with said second conductivity type base region and said first conductivity type source region through said second hole.

3. A method for manufacturing a MOS type semiconductor device, comprising the steps of:

forming a gate trench that extends from a surface of a second conductivity type base region formed on a first conductivity type drain layer;

forming an insulating film on a surface of said second conductivity base region and in said gate trench, and then forming a conductive film on the insulating film;

leaving a first part of said insulating film and said conductive film on said surface of said base region, and a second part of the insulating film and the conductive film that is located in said gate trench, while removing a remaining part of the insulating film and the conductive film;

forming first conductivity type source regions in a surface layer of said second conductivity type base region, and covering exposed surfaces of said first conductivity type source regions and remaining parts of said conductive film with an inter-layer insulation film;

forming a first hole through the inter-layer insulation film, and removing said first part of said insulating film and said conductive film left on said base region to form a second hole through the inter-layer insulation film; and forming a gate metal electrode and a source electrode such that the gate metal electrode is in contact with said gate electrode through said first hole and the source electrode is in contact with said second conductivity type base region and said first conductivity type source region through said second hole.

* * * * *